(12) United States Patent
Kim et al.

(10) Patent No.: US 7,544,607 B2
(45) Date of Patent: Jun. 9, 2009

(54) SEMICONDUCTOR DEVICE HAVING THIN FILM FORMED BY ATOMIC LAYER DEPOSITION AND METHOD FOR FABRICATING THE SAME

(75) Inventors: Yeong-kwan Kim, Suwon (KR); Dong-chan Kim, Seoul (KR); Seung-hwan Lee, Seoul (KR); Young-wook Park, Suwon (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 212 days.

(21) Appl. No.: 10/990,429

(22) Filed: Nov. 18, 2004

(65) Prior Publication Data

US 2005/0087828 A1 Apr. 28, 2005

Related U.S. Application Data

(62) Division of application No. 09/902,607, filed on Jul. 12, 2001, now Pat. No. 6,833,310.

(30) Foreign Application Priority Data

Oct. 19, 2000 (KR) .................................. 00-61548

(51) Int. Cl.
*H01L 21/4763* (2006.01)
*H01L 29/00* (2006.01)
*H01L 23/58* (2006.01)

(52) U.S. Cl. ................... 438/637; 257/506; 257/510; 257/635

(58) Field of Classification Search ........... 438/637; 257/506, 508, 510, 429, 368, 413, 639, 637, 257/374, 518, 647, 640, 635
See application file for complete search history.

(56) References Cited

U.S. PATENT DOCUMENTS

| | | | | |
|---|---|---|---|---|
| 5,879,459 A | * | 3/1999 | Gadgil et al. | 118/715 |
| 6,118,167 A | * | 9/2000 | DiSimone et al. | 257/510 |
| 6,177,307 B1 | * | 1/2001 | Tu et al. | 438/241 |
| 6,326,282 B1 | * | 12/2001 | Park et al. | 438/424 |
| 6,391,803 B1 | * | 5/2002 | Kim et al. | 438/787 |
| 6,461,937 B1 | * | 10/2002 | Kim et al. | 438/431 |
| 6,734,082 B2 | * | 5/2004 | Zheng et al. | 438/435 |

OTHER PUBLICATIONS

Wolf, et al., * Silicon Procesing for the VLSI Era: vol. 1—Process Technology, Lattice Press.
*Title: "Chemical Vapor Deposition of Amorphous and Polycrystalline Films", pp. 183-185, 191-194.

* cited by examiner

*Primary Examiner*—Chuong A. Luu
(74) *Attorney, Agent, or Firm*—Lee & Morse, P.C.

(57) ABSTRACT

A semiconductor device having a thin film formed by atomic layer deposition and a method for fabricating the same, wherein the semiconductor device includes a liner layer formed on an internal wall and bottom of a trench, gate spacers formed on the sidewalls of gate stack patterns functioning as a gate line, a first bubble prevention layer formed on the gate spacers and the gate stack patterns, bit line spacers formed on the sidewalls of bit line stack patterns functioning as a bit line, and a second bubble prevention layer formed on the bit line spacers and the gate stack patterns and at least one of the above is formed of a multi-layer of a silicon nitride layer and a silicon oxide layer, or a multi-layer of a silicon oxide layer and a silicon nitride layer, thereby filling the trench, gate stack patterns, or bit line stack patterns without a void.

16 Claims, 10 Drawing Sheets

SEMICONDUCTOR DEVICE HAVING THIN FILM FORMED BY ATOMIC LAYER DEPOSITION AND METHOD FOR FABRICATING THE SAME

This application is a DIVISION of application Ser. No. 09/902,607, filed Jul. 12, 2001 now U.S. Pat. No. 6,833,310.

BACKGROUND OF THE INVENTION

1. Field of the Invention

The present invention relates to a semiconductor device and a method for fabricating the same. More particularly, the present invention relates to a semiconductor device having a thin film formed by atomic layer deposition and a method for fabricating the same.

2. Description of the Related Art

As semiconductor devices become more highly integrated, the fabrication of such semiconductor devices becomes increasingly difficult. In particular, a thin film used in the fabrication of semiconductor devices, for example, a silicon oxide layer or a silicon nitride layer, must be formed to have an excellent step coverage at a low temperature. In order to meet these demands, a thin film is formed using low pressure chemical vapor deposition (CVD).

FIG. 1 illustrates a schematic diagram of an apparatus for forming a thin film by conventional low pressure chemical vapor deposition. Referring to FIG. 1, a boat 3 on which a plurality of wafers 2 (semiconductor substrates) are mounted and a boat support 9 for supporting the boat 3 are installed in an inner tube 1 in the apparatus for forming a thin film by conventional low pressure chemical vapor deposition. The inner tube 1 is enclosed by an outer tube 5 which in turn is partially enclosed by a heater 7. A low pressure vacuum can be maintained inside the inner tube 1 and the outer tube 5 by a vacuum pump (not shown) connected to the lower right side of the inner tube 1. A reactive gas flows into the lower left side of the inner tube 1. At a temperature of 500~800□C. and a pressure of several Torr a thin film is formed on the wafers 2. Then, an unreacted gas exhausts through the lower right side of the outer tube 5 by way of vacuum exhaustion. In FIG. 1, reference numeral 11 denotes an elevator for moving the boat 3 vertically, reference numerals 13 and 15 denote a vacuum manifold and a gas manifold, respectively, and reference numeral 17 denotes a vacuum flange.

However, the above mentioned apparatus for forming a thin film by low pressure chemical vapor deposition results in a high reaction temperature, and the thin film is formed on the plurality of wafers in a batch type, thereby increasing the thermal budget of the wafers.

Also, a process of consecutively forming a silicon oxide layer and a silicon nitride layer is widely used in fabricating the semiconductor device. The process of forming the silicon oxide layer and the silicon nitride layer must be separately performed in the apparatus for forming a thin film by conventional low pressure chemical vapor deposition, thereby causing an undesirable vacuum break.

SUMMARY OF THE INVENTION

To solve the above problems, it is a first feature of an embodiment of the present invention to provide a semiconductor device having a thin film formed by atomic layer deposition such that a low thermal budget is maintained and a vacuum break is prevented.

It is a second feature of an embodiment of the present invention to provide a method for fabricating a semiconductor device having a thin film formed by atomic layer deposition such that a low thermal budget is maintained and a vacuum break is prevented.

Accordingly, to provide the first feature, there is provided a semiconductor device. A trench is formed in a semiconductor substrate, and a liner layer is formed on the sidewalls and bottom of the trench. A buried insulating layer is filled in the trench, and a plurality of gate stack patterns are formed on the semiconductor substrate, and a plurality of gate spacers are formed on the sidewalls of the gate stack patterns. A first bubble prevention layer is formed of a multi-layer of a silicon oxide layer and a silicon nitride layer on the gate spacers by atomic layer deposition, and a first filling insulating layer is filled without a void between the gate stack patterns on the first bubble prevention layer. A plurality of bit line stack patterns are formed on the first filling insulating layer, and a plurality of bit-line spacers are formed on the sidewalls of the bit line stack patterns. A second bubble prevention layer is formed of a multi-layer of a silicon oxide layer and a silicon nitride layer on the bit line spacers and on the bit line stack patterns by atomic layer deposition, and a second filling insulating layer is filled without a void between the bit line stack patterns on the second bubble prevention layer.

The liner layer, the gate spacers, the first bubble prevention layer, the bit line spacers, and the second bubble prevention layer, each is formed of a multi-layer of a silicon nitride layer and a silicon oxide layer or a multi-layer of a silicon oxide layer and a silicon nitride layer by atomic layer deposition.

In order to provide the second feature, there is provided a method for fabricating a semiconductor device. A trench is formed to a predetermined depth on a semiconductor substrate, and then, a liner layer formed of a multi-layer of a silicon nitride layer and a silicon oxide layer is formed on the sidewalls and bottom of the trench by atomic layer deposition. Subsequently, a buried insulating layer is formed in the trench without a void, and a plurality of gate stack patterns are formed on the semiconductor substrate in which the trench and the buried insulating layer are formed. Subsequently, a plurality of gate spacers are formed on the sidewalls of the gate stack patterns, and a first bubble prevention layer of a multi-layer of a silicon oxide layer and a silicon nitride layer is formed on the gate spacers and on the gate stack patterns by atomic layer deposition. Subsequently, a first filling insulating layer is formed without a void between the gate stack patterns on the first bubble prevention layer, and a plurality of bit line stack patterns are formed on the first filling insulating layer. Subsequently, a plurality of bit line spacers are formed on the sidewalls of the bit line stack patterns, and a second bubble prevention layer of a multi-layer of a silicon oxide layer and a silicon nitride layer is formed on the bit line spacers and on the bit line stack patterns by atomic layer deposition. Lastly, a second filling insulating layer is formed without a void between the bit line stack patterns on the second bubble prevention layer.

The liner layer, the gate spacers, the first bubble prevention layer, the bit line spacers, and the second bubble prevention layer, each is formed of a multi-layer of a silicon nitride layer and a silicon oxide layer or a multi-layer of a silicon oxide layer and a silicon nitride layer by atomic layer deposition.

As described above, the effect of each element formed of the multi-layer is different. For example, the liner layer, the first bubble prevention layer, and the second bubble prevention layer can form the buried insulating layer, the first filling insulating layer, and the second filling insulating layer, respectively without voids. The gate spacers and the bit line spacers have excellent step coverage, and thus can stabilize an etching selectivity between a material layer used to form the same spacers and a lower layer, for example, the etching selectivity between the semiconductor substrate and the first filling insulating layer, during etching for formation of the spacers. As a result, a thickness of the material layer required for forming a spacer is reduced, and accordingly, a loading capacitance is also reduced. The thermal budget of a semiconductor substrate can be reduced by using atomic layer deposition instead of conventional low pressure chemical vapor deposition to form the liner layer, the gate spacers, the first bubble prevention layer, the bit line spacers, and the second bubble prevention layer. Additionally, by using atomic layer deposition, the liner layer, the gate spacers, the first bubble prevention layer, the bit line spacers, and the second bubble prevention layer can all be formed without a vacuum break.

These and other features and aspects of the present invention will be readily apparent to those of ordinary skill in the art upon review of the detailed description that follows.

BRIEF DESCRIPTION OF THE DRAWINGS

The above features and advantages of the present invention will become more apparent by describing in detail a preferred embodiment thereof with reference to the attached drawings in which:

FIGS. 8A through 11A, and FIGS. 8B through 11B illustrate sectional views taken along lines A-A and B-B, respectively, of FIG. 5 depicting a method for fabricating a semiconductor device.

DETAILED DESCRIPTION OF THE INVENTION

Figure 1:
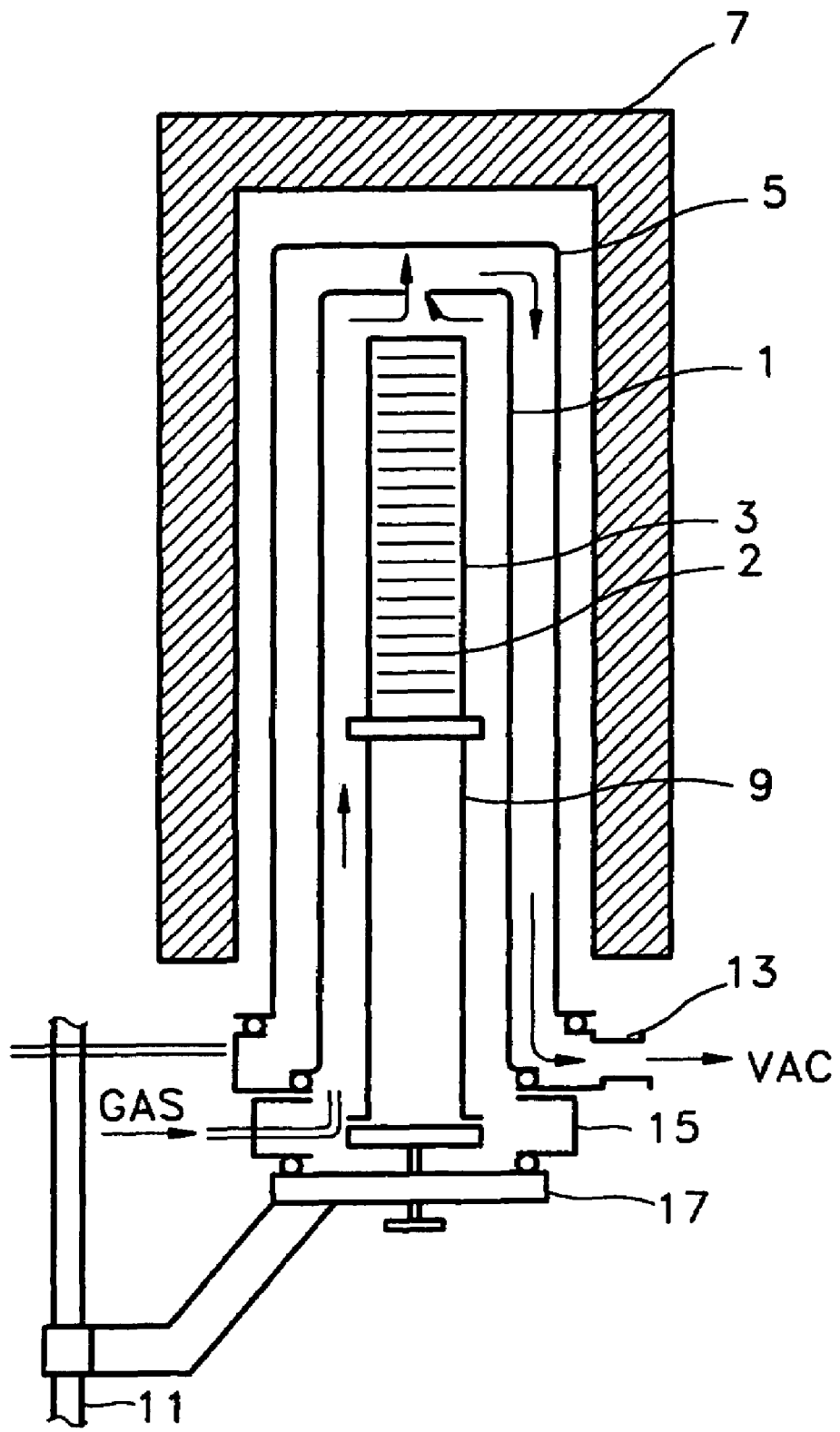
FIG. 1 illustrates a schematic diagram of an apparatus for forming a thin film by conventional low pressure chemical vapor deposition according to the prior art.

Korean Patent Application No. 00-61548, filed on Oct. 19, 2000, and entitled: "Semiconductor Device Having Thin Film Formed by Atomic Layer Deposition and Method for Fabricating the Same," is incorporated by reference herein in its entirety.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those or ordinary skill in the art.

In the drawings, the thickness of layers and regions are exaggerated for clarity. It will be understood that when an element such as a layer, region or substrate is referred to as being "on" another element, it may be directly on the other element or intervening elements may also be present.

Figure 2:
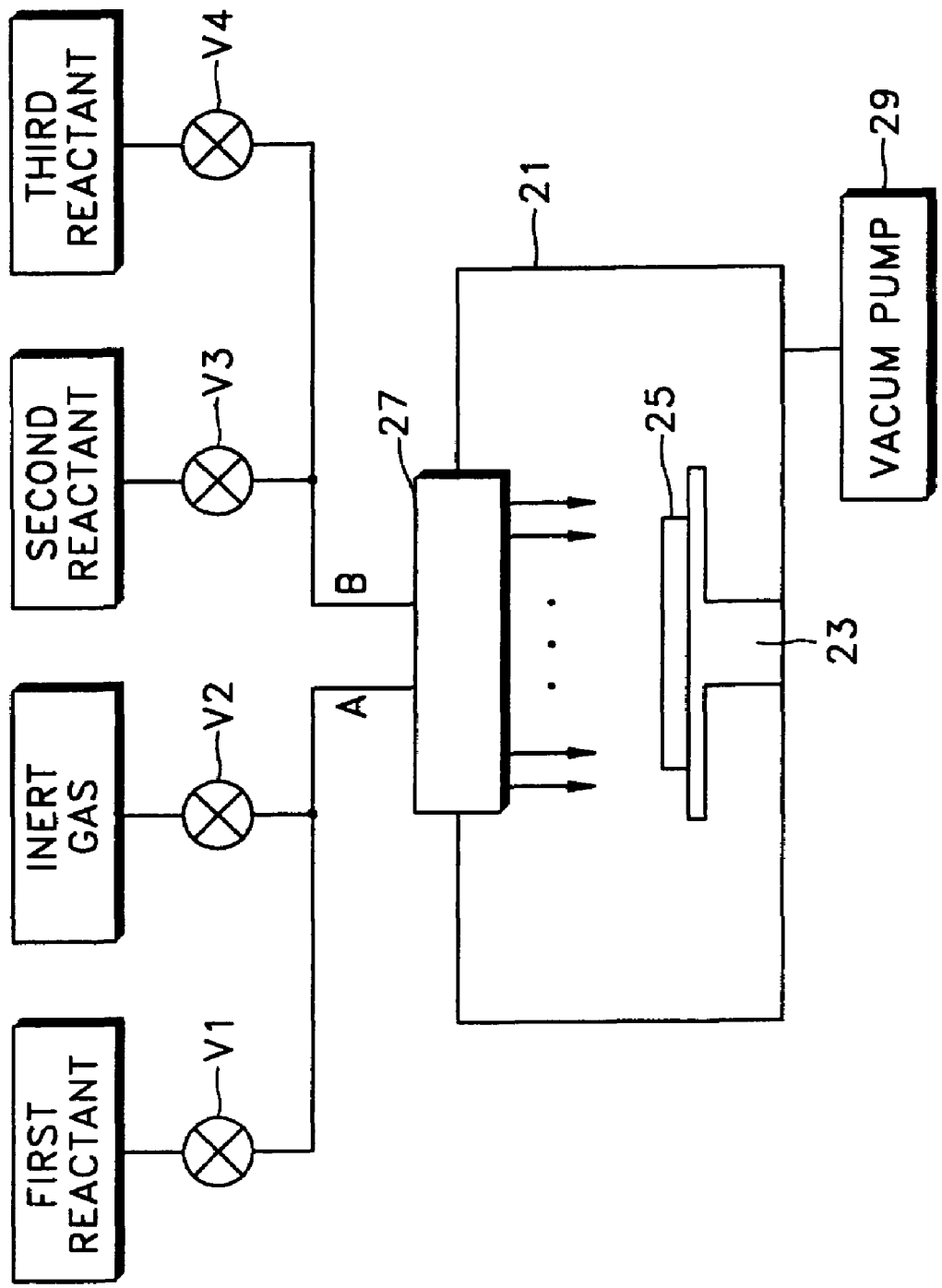
FIG. 2 illustrates a schematic diagram of an apparatus for forming a thin film by atomic layer deposition according to the present invention.

FIG. 2 illustrates a schematic diagram of an apparatus for forming a thin film by atomic layer deposition according to the present invention. Specifically, the apparatus for forming a thin film by atomic layer deposition includes a reaction chamber 21 heated by an external heater (not shown), a semiconductor substrate 25 such as silicon substrate, a susceptor 23 installed at the bottom of the reaction chamber 21 to mount the semiconductor substrate 25, a shower head 27 installed at an upper portion of the susceptor 23 to inject reactant gases into the inside of the reaction chamber 21, and a vacuum pump 29 connected to the reaction chamber 21 to control pressure in the reaction chamber 21.

Two separate gas inlets A and B are connected to the shower head 27. A first reactant, an inert gas and a second reactant or a third reactant are injected into the shower head 27 through the gas inlet A or B. The first reactant is a silane gas obtained by injecting a carrier gas into a bubbler (not shown) containing silane ($SiH_4$), the inert gas is a nitrogen gas or an argon gas, the second reactant is water ($H_2O$) obtained by injecting the carrier gas into a bubbler (not shown) containing water ($H_2O$), and the third reactant is an ammonia gas obtained by injecting the carrier gas into a bubbler containing ammonia ($NH_3$).

The first reactant is injected into the reaction chamber 21 through the gas inlet A, and the second reactant and the third reactant are injected into the reaction chamber 21 through the gas inlet B. The reason the gas inlet for the first reactant is different from the gas inlet for the second reactant and the third reactant is to prevent the first reactant from reacting with the second or the third reactant in one gas inlet, A or B. Injection of the first reactant and the inert gas into the reaction chamber 21 is controlled by a first valve V1 and a second valve V2, respectively. Injection of the second reactant and the third reactant into the reaction chamber 21 is controlled by a third valve V3 and a fourth valve V4, respectively.

Figure 3:
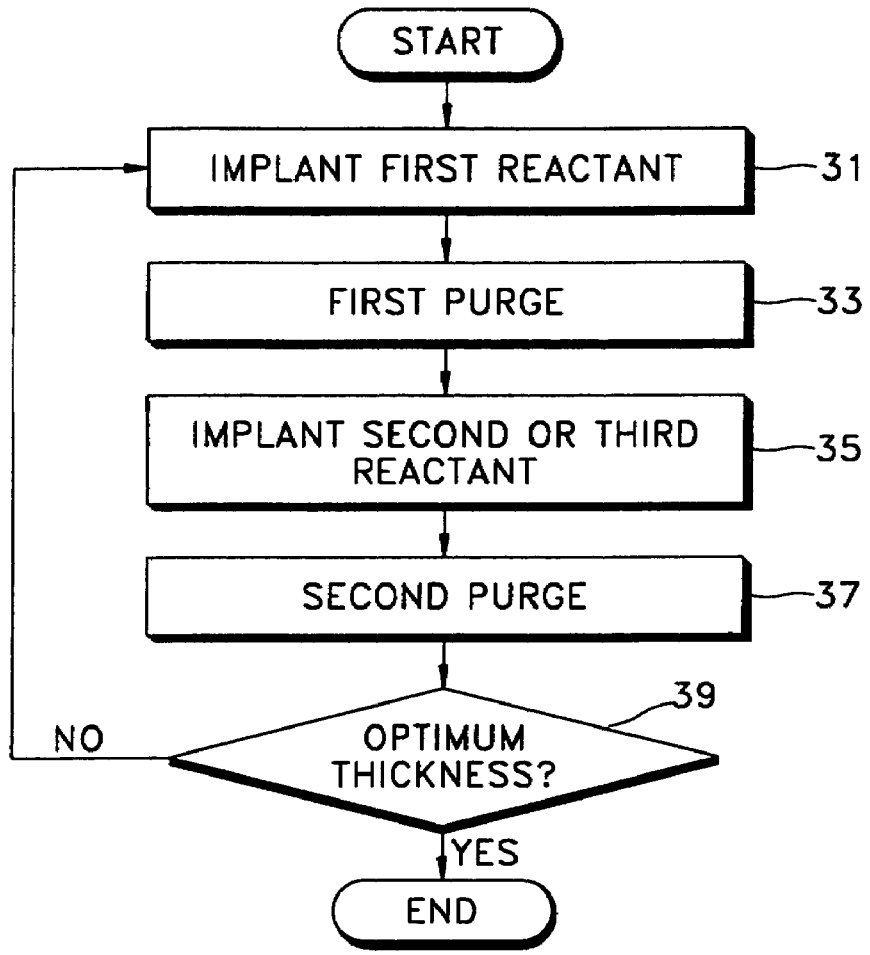
FIG. 3 illustrates a flow chart for the steps of forming a thin film on a semiconductor device according to the present invention by atomic layer deposition.
Figure 4:
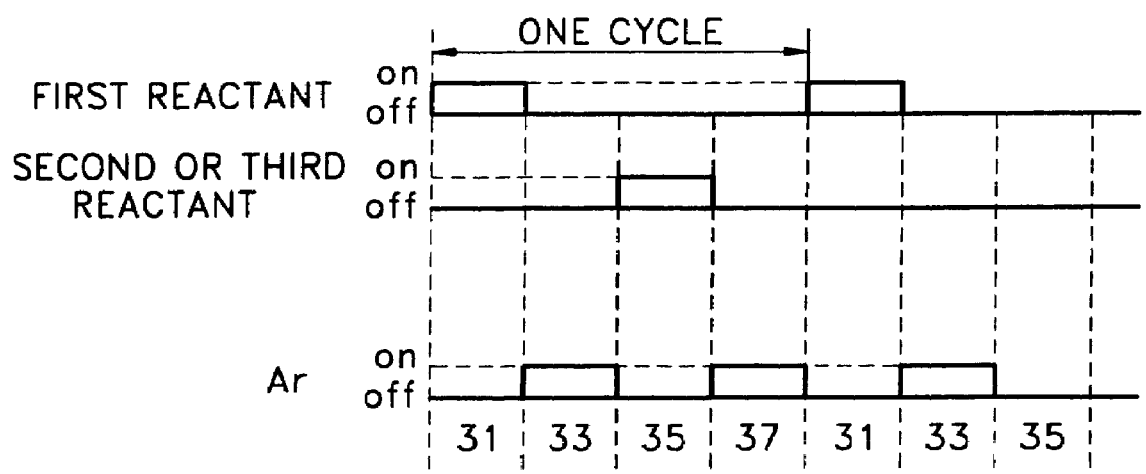
FIG. 4 illustrates a timing diagram depicting when the reactants are supplied in order to form a thin film on a the semiconductor device according to the present invention by atomic layer deposition.

FIG. 3 illustrates a flowchart for the steps of forming a thin film on a semiconductor device according to the present invention, by atomic layer deposition. FIG. 4 illustrates a timing diagram depicting when the reactants are supplied in order to form a thin film on the semiconductor device according to the present invention by atomic layer deposition. More specifically, in step 31, silane gas, which is the first reactant, is injected into the reaction chamber 21 in which a semiconductor substrate such as a silicon substrate, is loaded, at a set process temperature of 350 □C. when forming a silicon oxide layer or 450 □C. when forming a silicon nitride layer, thereby adsorbing silicon onto the semiconductor substrate. The silane gas is obtained by flowing an argon carrier gas at a flow rate of 450 standard cubic centimeters (sccm) into a bubbler containing silane ($SiH_4$) for 60 seconds.

Next, in step 33, the argon carrier gas 450 sccm is purged from the reaction chamber 21. In this case, any physically adsorbed silane is removed, and any chemically adsorbed silicon remains on the semiconductor substrate.

Then, in step 35, water ($H_2O$) which is the second reactant, is injected into the reaction chamber 21 in order to form a silicon oxide layer on the semiconductor device on which the silicon is chemically adsorbed. The water ($H_2O$) is obtained by flowing the argon carrier gas at a flow rate of 450 sccm into a bubbler containing de-ionized water for 60 seconds. Alternatively, in step 35, an ammonia ($NH_3$) gas, which is the third reactant, is injected into the reaction chamber 21 in order to form a silicon nitride layer on the semiconductor substrate on which the silicon is chemically adsorbed. The ammonia gas is obtained by flowing the argon carrier gas at a flow rate of 450 sccm into a bubbler containing ammonia ($NH_3$) for 60 seconds.

Subsequently, in step 37, an argon inert gas at a flow rate of 450 sccm is purged from the reaction chamber 21, and by-products, for example, hydrochloride (HCl) or ammonium chloride ($NH_4Cl$), are removed. In this case, an atomic layer unit of the silicon oxide layer or the silicon nitride layer is formed by chemical reaction 1 and chemical reaction 2, respectively if $SiCl_4$ is used as the first reactant.

$$SiCl_4 + 2H_2O \rightarrow SiO_2 + 4HCl \quad \text{[Chemical Reaction 1]}$$

$$3SiCl_4 + 4NH_3 \rightarrow Si_3N_4 + 12HCl \quad \text{[Chemical Reaction 2]}$$

Next, in step 39, whether the thickness of an atomic layer unit of the silicon oxide layer or the silicon nitride layer is optimum is checked. If not, steps 31 to 37 are cyclically repeated until the optimum thickness is obtained. In this case, a silicon oxide layer with a thickness of about 1 Å per cycle or a silicon nitride layer with a thickness of about 1 Å per cycle is formed with a step coverage of 100±2%.

In the preferred embodiment, silane gas is used as the first reactant. However, silane gas may be replaced by a Si-alkoxide, a Si-alkyl, a Si-halide and a Si-amide as a first reactant for forming the silicon oxide layer. Also, $H_2O_2$, $O_3$, plasma $O_2$, $N_2O$, or plasma $N_2O$ may be used in place of water, a second reactant for forming the silicon oxide layer.

For forming the silicon nitride layer, a Si-alkoxide, a Si-alkyl, a Si-halide or a Si-amide may be used in place of silane gas as a first reactant. Plasma ammonia or plasma $N_2O$ may be used in place of ammonia as a third reactant for forming the silicon nitride layer.

Figure 5:
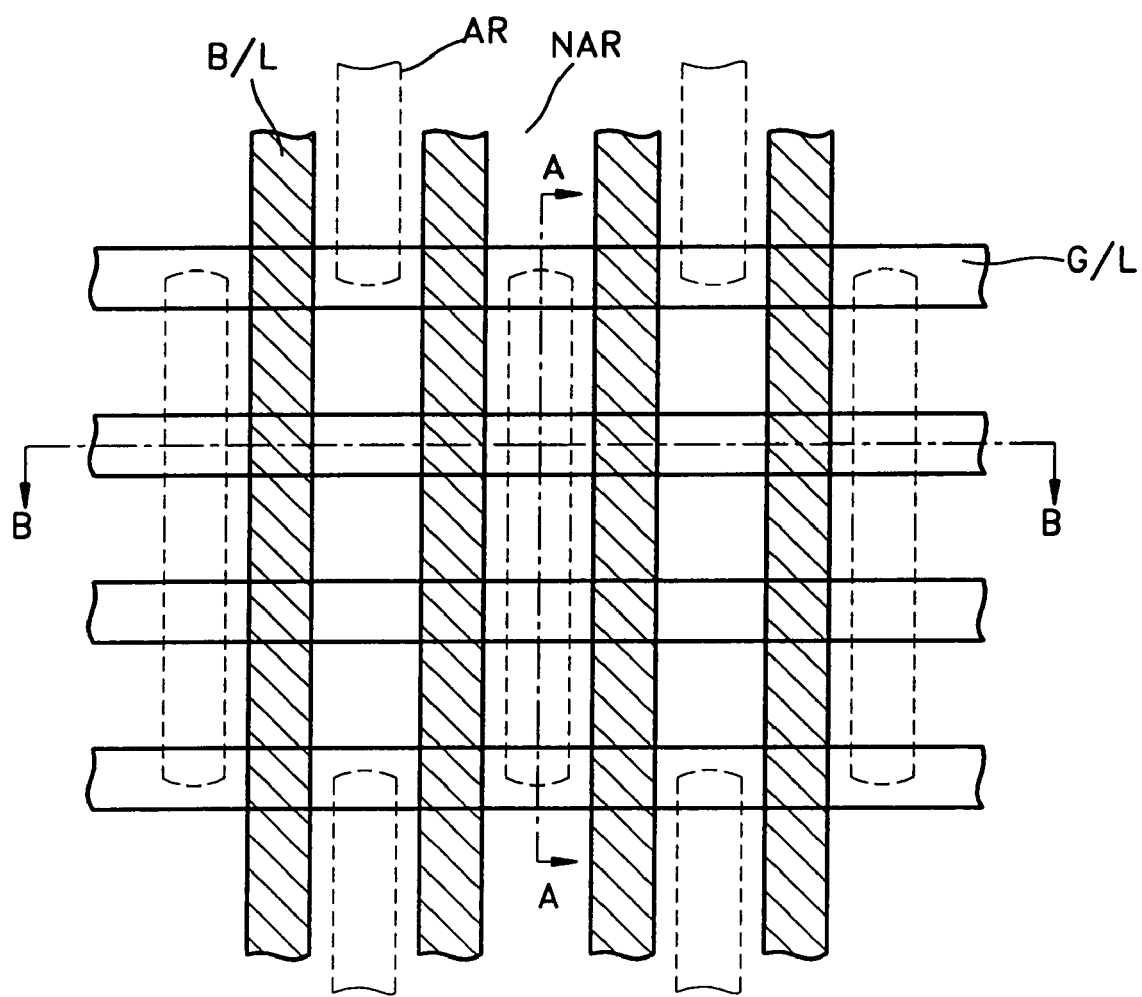
FIG. 5 illustrates a layout diagram of a semiconductor device having a thin film formed by atomic layer deposition of FIGS. 2 through 4, according to the present invention.

FIG. 5 illustrates a layout diagram of the semiconductor device having a thin film formed by atomic layer deposition of FIGS. 2 through 4, according to the present invention. Specifically, a gate line G/L is horizontally formed on a semiconductor substrate (100 of FIGS. 6 through 11B) and is divided into an active region AR marked by a dotted line and a non-active region NAR. A bit line B/L is vertically formed to be perpendicular to the gate line G/L.

Figure 6:
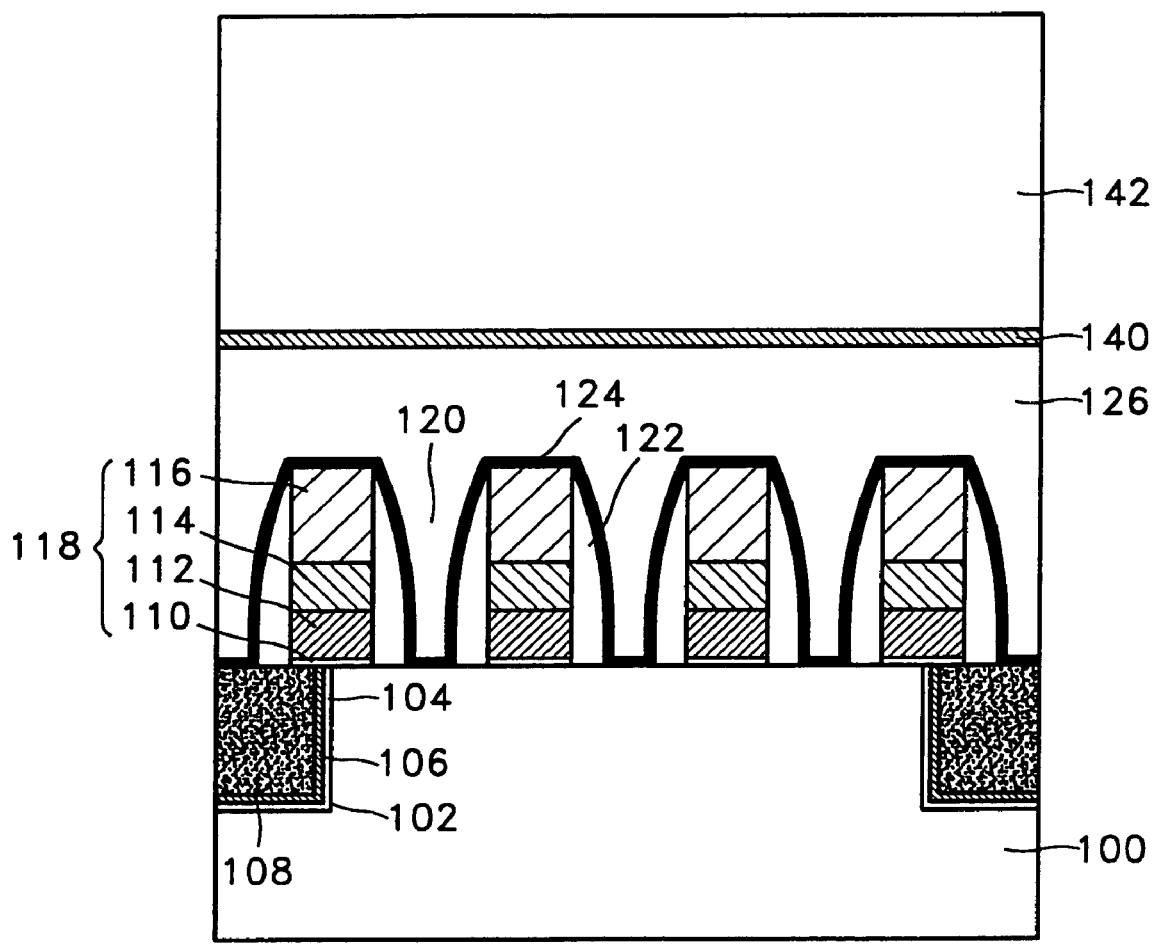
FIGS. 6 and 7 illustrate sectional views taken along lines A-A and B-B, respectively, of FIG. 5 of a semiconductor device having a thin film formed by atomic layer deposition.
Figure 7:
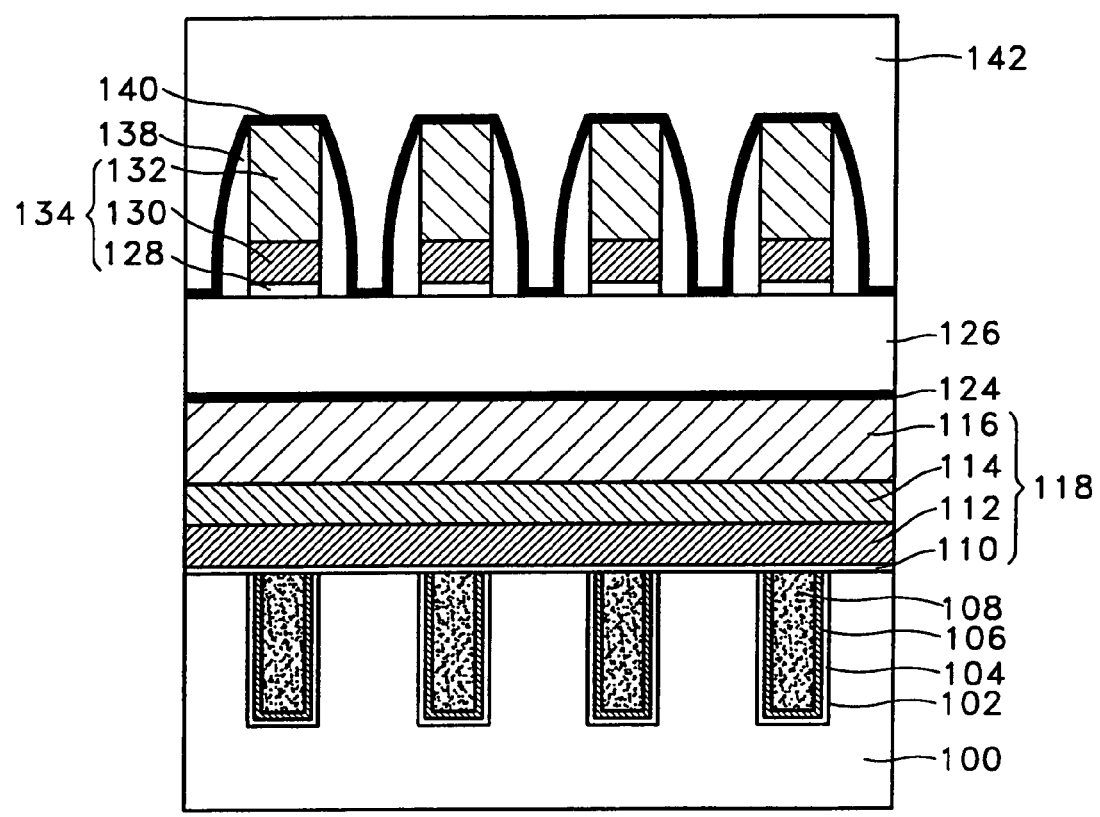

FIGS. 6 and 7 illustrate sectional views taken along lines A-A and B-B of FIG. 5, respectively, of the semiconductor device having a thin film formed by atomic layer deposition. Specifically, the semiconductor device is divided into an active region (AR of FIG. 5) and a non-active region (NAR of FIG. 5) by a trench 102. The trench is formed to a predetermined depth on the semiconductor substrate. A trench oxide layer 104 is formed on the sidewalls and bottom of the trench 102 to reduce the damage caused by etching during the formation of the trench. A liner layer 106 is formed on the trench oxide layer 104 in the trench 102. The liner layer 106 is formed of a multi-layer of a silicon nitride layer and a silicon oxide layer by atomic layer deposition, as described in FIGS. 2 through 4. Since the liner layer 106 formed by atomic layer deposition has excellent step coverage, a buried insulating layer 108 filled in the trench 102 is formed without a void. The thermal budget of a semiconductor substrate 100 can be reduced by using the atomic layer deposition instead of low pressure chemical vapor deposition to form the liner layer 106. Additionally, by using atomic layer deposition, the liner layer 106 can be formed without a vacuum break. If atomic layer deposition is used to form the trench oxide layer 104, the thermal budget of the semiconductor substrate 100 can be further reduced.

A plurality of gate stack patterns 118 and holes (120 of FIG. 9A) for exposing the semiconductor substrate 100 between the gate stack patterns 118 are formed on the semiconductor substrate 100. The gate stack patterns 118 function as the gate lines G/L of FIG. 5. Each gate stack pattern 118 is formed by sequentially stacking a gate insulating layer 110, a first gate conductive layer 112, a second gate conductive layer 114, and a gate capping layer 116. The gate insulating layer 110 is formed of a silicon oxide layer, the first gate conductive layer 112 is formed of an impurity-doped polysilicon layer, the second gate conductive layer 114 is formed of a metal silicide layer such as a tungsten silicide layer, and the gate capping layer 116 is formed of a silicon nitride layer.

Gate spacers 122 are formed on the sidewalls of the gate stack patterns 118. A first bubble prevention layer 124 is formed on the gate spacers 122 and on the gate stack patterns 118. The gate spacers 122 and the first bubble prevention layer 124 are formed of a multi-layer of the silicon oxide layer and the silicon nitride layer by atomic layer deposition, as described in FIGS. 2 through 4.

In a case where the gate spacer 122 are formed of the multi-layer by atomic layer deposition, the gate spacers 122 have excellent step coverage and can stabilize an etching selectivity between a material layer for forming the gate spacers 122 and the semiconductor substrate 100 during etching for formation of the gate spacers 122. As a result, the thickness of the material layer for forming the gate spacers 122 can be reduced, and loading capacitance can be reduced. The first bubble prevention layer 124 that is formed by atomic layer deposition has excellent step coverage, and can assist in the formation of a first filling insulating layer 126 without a void. The thermal budget of a semiconductor substrate 100 can be reduced by using atomic layer deposition instead of low pressure chemical vapor deposition to form the gate spacers 122 and the first bubble prevention layer 124. Additionally, the gate spacers 122 and the first bubble prevention layer 124 can be formed without a vacuum break.

A plurality of bit line stack patterns 134 and holes (136 of FIG. 11B) between the bit line stack patterns 134 are formed on the first filling insulting layer 126. The bit line stack patterns 134 function as the bit lines B/L as shown in FIG. 5. Each bit line stack pattern 134 is formed of a barrier metal layer 128, a bit line conductive layer 130, and a bit line capping layer 132. Bit line spacers 138 are formed on the sidewalls of the bit line stack patterns 134, and a second bubble prevention layer 140 is formed on the bit line spacers 138 and on the bit line stack patterns 134.

The bit line spacers 138 and the second bubble prevention layer 140 are formed of a multi-layer of the silicon oxide layer and the silicon nitride layer by atomic layer deposition, as described in FIGS. 2 through 4.

In a case where the bit line spacers 138 are formed of the multi-layer by atomic layer deposition, the bit line spacers 138 have excellent step coverage and can stabilize an etching selectivity between the first filling insulating layer 126 and a material layer for forming the bit line spacers 138 during etching for formation of the bit line spacers 138. As a result, the thickness of the material layer for forming the bit line spacers 138 can be reduced, and loading capacitance can be reduced. The second bubble prevention layer 140 that is formed by atomic layer deposition has excellent step coverage, and can assist in the formation of a second filling insulating layer 142 without a void. The thermal budget of a semiconductor substrate 100 can be reduced by using atomic layer deposition instead of low pressure chemical vapor deposition to form the bit line spacers 138 and the second bubble prevention layer 140. Additionally, the bit line spacers 138 and the second bubble prevention layer 140 can be formed without a vacuum break.

FIGS. 8A through 11A and FIGS. 8B through 11B illustrate sectional views taken along the lines A-A and B-B of FIG. 5, respectively, illustrating a method for fabricating the semiconductor device.

Figure 8A:
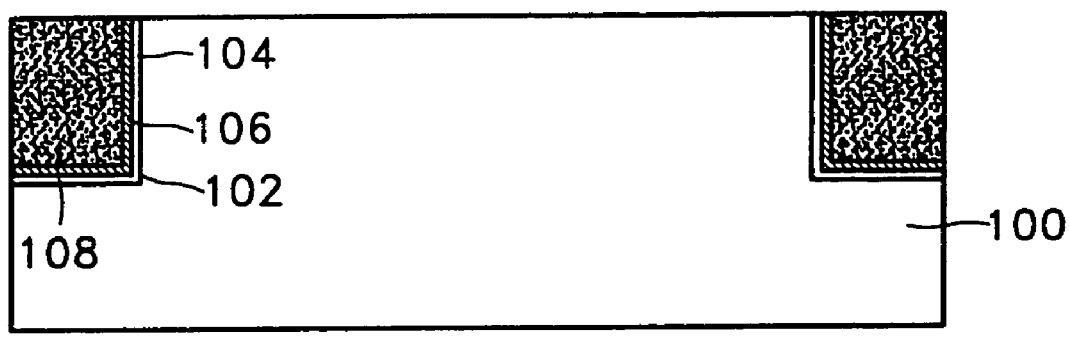
Figure 8B:
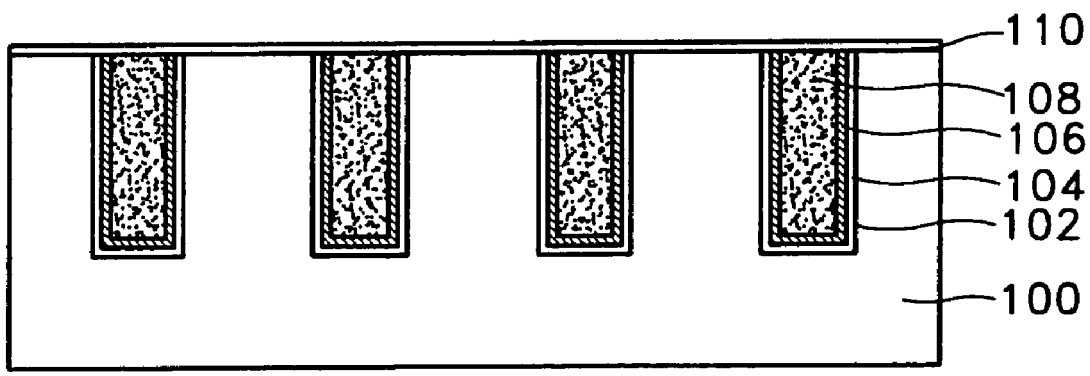

FIGS. 8A and 8B depict the steps of forming an active region. Specifically, a trench 102 with a predetermined depth is formed by plasma-etching a predetermined region of a semiconductor substrate 100 using a photolithographic process. Subsequently, in order to reduce the damage caused to the semiconductor substrate 100 during the plasma-etching, a trench oxide layer 104 is formed on the sidewalls and bottom of the trench 102.

Next, a liner layer 106 is formed on the trench oxide layer 104 formed on the trench oxide layer 104. The liner layer 106 is formed of a multi-layer of the silicon nitride layer and the silicon oxide layer by atomic layer deposition, as described in FIGS. 2 through 4. The liner layer 106 formed by atomic layer deposition has excellent step coverage and can assist in the formation of a buried insulating layer without a void. The thermal budget of a semiconductor substrate 100 can be reduced by using atomic layer deposition instead of low pressure chemical vapor deposition to form the liner layer 106. Additionally, the liner layer 106 can be formed without a vacuum break.

In a preferred embodiment, only the liner layer 106 is formed by atomic layer deposition. However, the trench oxide layer 104 and the liner layer 106 may be consecutively formed by atomic layer deposition. In this case, the effect is the same as the case where only the liner layer 106 is formed by atomic layer deposition, and the thermal budget of the semiconductor substrate 100 can be further reduced.

Subsequently, an insulating layer such as a silicon oxide layer, is formed on the entire surface of the semiconductor substrate 100 on which the trench 102 is formed to fill the trench 102. The silicon oxide layer is planarized, thereby forming a buried insulating layer 108. In this case, the semiconductor substrate 100 is divided into a non-active region where the buried insulating layer 108 is formed and an active region.

Figure 9A:
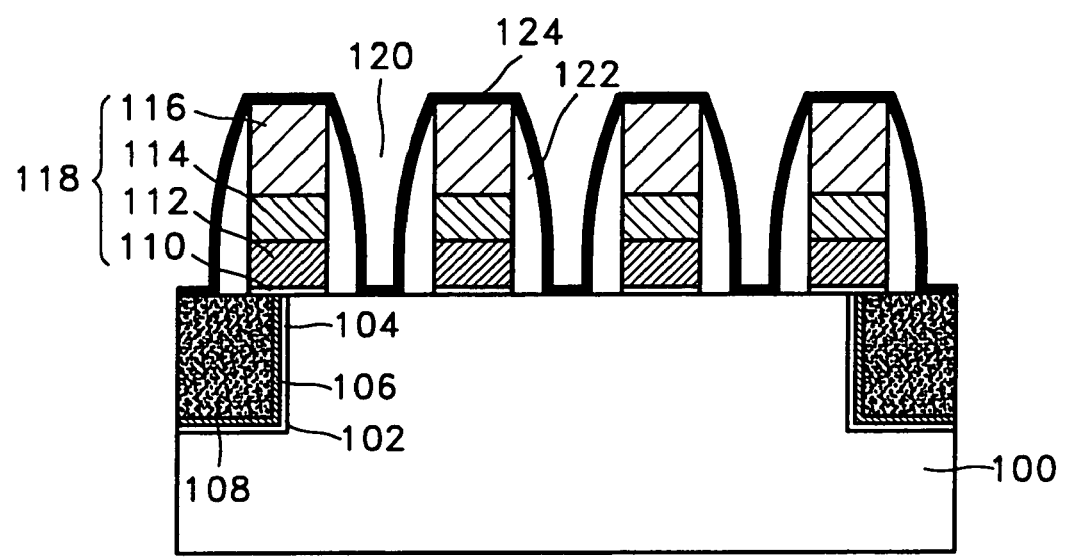
Figure 9B:
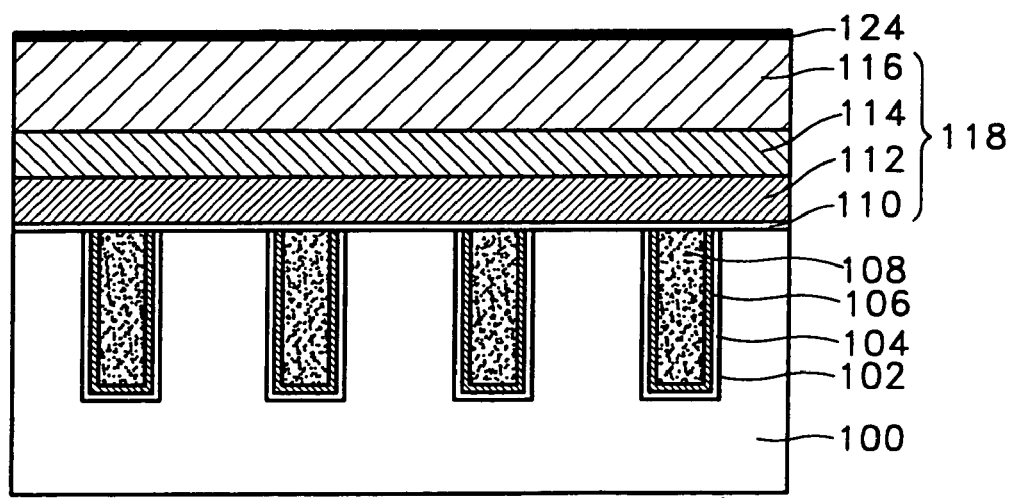

FIGS. 9A and 9B depict the steps of forming a plurality of gate stack patterns 118, gate spacers 122, and a first bubble prevention layer 124. Specifically, a plurality of gate stack patterns 118 are formed on a semiconductor substrate 100 that is divided into an active region and a non-active region. Holes 120 for exposing the semiconductor substrate 100 are formed between the gate stack patterns 118. The gate stack patterns 118 function as the gate lines G/L of FIG. 5. Each gate stack pattern 118 is formed by sequentially stacking a gate insulating layer 110, a first gate conductive layer 112, a second gate conductive layer 114, and a gate capping layer 116, and patterning them. The gate insulating layer 110 is formed of a silicon oxide layer, the first gate conductive layer 112 is formed of an impurity-doped polysilicon layer, the second gate conductive layer 114 is formed of a metal silicide layer such as a tungsten silicide layer, and the gate capping layer 116 is formed of a silicon nitride layer.

Next, a material layer for forming the spacers (not shown) is formed on the entire surface of the semiconductor substrate 100 on which the gate stack patterns 118 are formed. The material layer for forming the gate spacers 122 is etched, thereby forming the gate spacers 122 on the sidewalls of the gate stack patterns 118. The gate spacers 122 are formed of a multi-layer of the silicon oxide layer and the silicon nitride layer by atomic layer deposition, as illustrated in FIGS. 2 through 4.

Since the gate spacers 122 formed of a multi-layer by atomic layer deposition have excellent step coverage and a low content of hydrogen impurities, the gate spacers 122 have high etching selectivity between the material layer for forming the gate spacers 122 and the semiconductor substrate 100 so that the thickness of the material layer for the gate spacers 122 can be reduced, and loading capacitance can be reduced. Thermal budget of a semiconductor substrate 100 can be reduced by using atomic layer deposition instead of low pressure chemical vapor deposition to form the gate spacers 122. Additionally, the gate spacers 122 can be formed without a vacuum break.

Subsequently, the first bubble prevention layer 124 is formed on the entire surface of the semiconductor substrate 100 on which the gate stack patterns 118 and the gate spacers 122 are formed. The first bubble prevention layer 124 is formed of a multi-layer of the silicon oxide layer and the silicon nitride layer by atomic layer deposition, as described in FIGS. 2 through 4. The first bubble prevention layer 124 formed by atomic layer deposition has excellent step coverage so that a first filling insulating layer 126 can be formed without a void in the holes 120 between the gate stack patterns 118. The thermal budget of a semiconductor substrate 100 can be reduced by using atomic layer deposition instead of low pressure chemical vapor deposition to form the first bubble prevention layer 124. Additionally, the first bubble prevention layer 124 can be formed without a vacuum break.

Figure 10A:
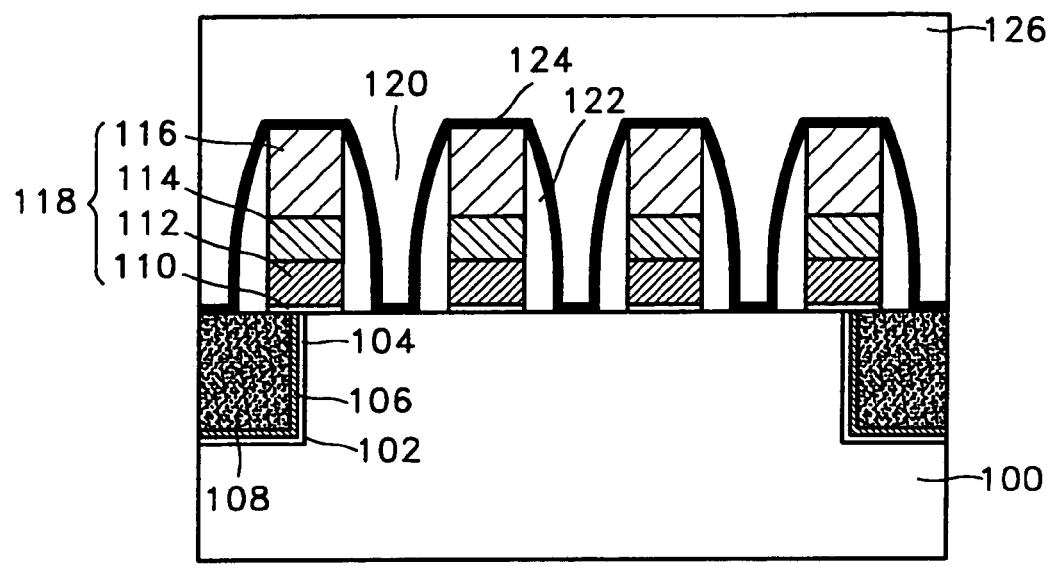
Figure 10B:
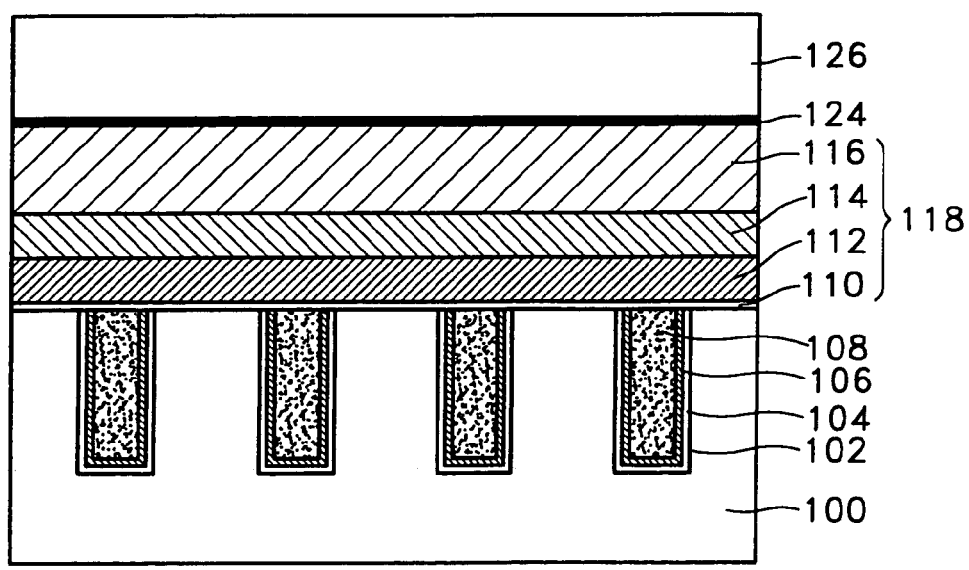

FIGS. 10A and 10B depict the steps of forming a first filling insulating layer 126. Specifically, the first filling insulating layer 126 such as a silicon oxide layer, is formed on the entire surface of the semiconductor substrate 100 on which the gate stack patterns 118, the gate spacers 122, and the first bubble prevention layer 124 are formed, to fill the holes 120 between the gate stack patterns. Here, as described above, the first filling insulating layer 126 can be formed without a void in the holes 120 between the gate stack patterns 118 because the first bubble prevention layer 124 has excellent step coverage.

Figure 11A:
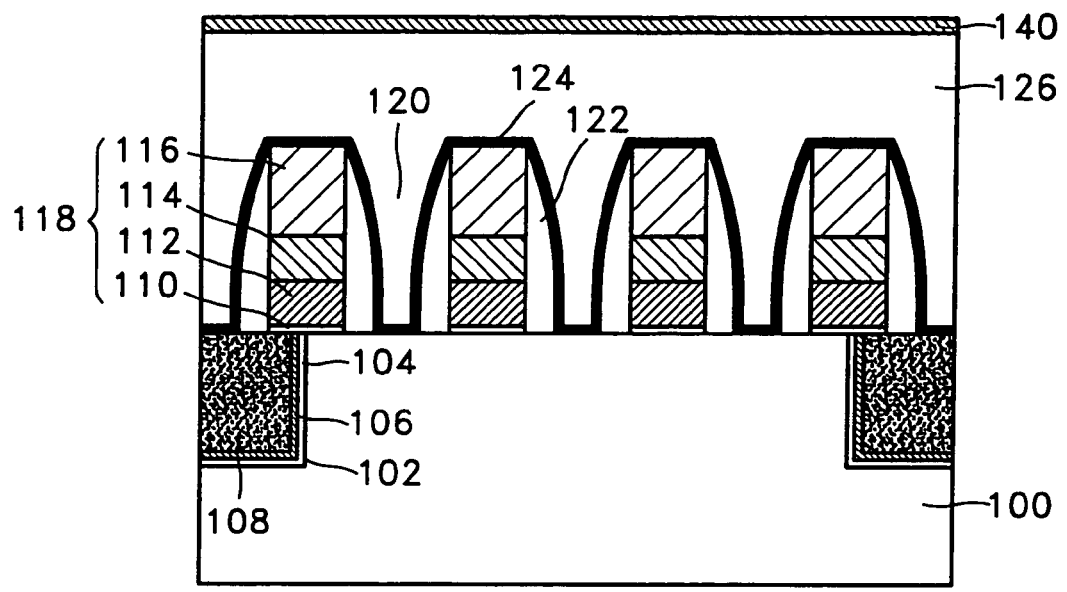
Figure 11B:
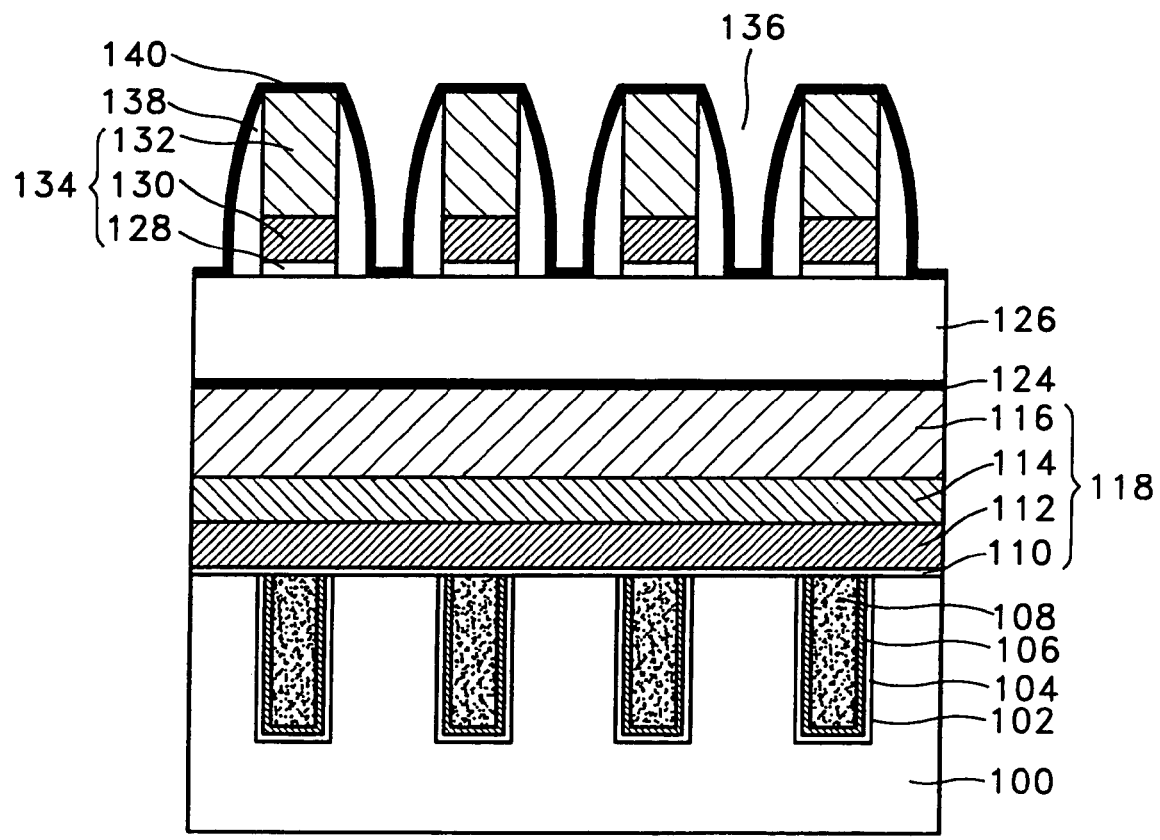

FIGS. 11A and 11B depict the steps of forming a plurality of bit line stack patterns 134, bit line spacers, and a second bubble prevention layer. Specifically, a plurality of bit line stack patterns 134 are formed on the first filling insulating layer 126. The bit line stack patterns 134 function as the bit lines B/L shown in FIG. 5. Each bit line stack pattern 134 is formed by sequentially stacking a barrier metal layer 128, which is formed by sequentially forming Titanium (Ti) and Titanium Nitride (TiN) on the first filling insulating layer 126; a bit line conductive layer 130, which is formed by sequentially forming polysilicon and Tungsten Silicide (WSi) on the barrier metal layer 128; and a bit line capping layer 132, which may be formed of silicon oxide, or preferably silicon nitride $Si_3N_4$, and patterning the barrier metal layer 128, the bit line conductive layer 130 and the bit line capping layer 132. Holes 136 for exposing the first filling insulating layer 126 are formed between the bit line stack patterns 134.

Next, a material layer for forming bit line spacers (not shown) is formed on the entire surface of the semiconductor substrate 100 on which the bit line stack patterns 134 are formed. The material layer for forming a spacer is etched, thereby forming bit line spacers 138 on the sidewalls of the bit line stack patterns 134. The bit line spacers 138 are formed of a multi-layer of the silicon oxide layer and the silicon nitride layer by atomic layer deposition, as described in FIGS. 2 through 4.

Since the bit line spacers 138 formed of a multi-layer by atomic layer deposition have excellent step coverage and a low content of hydrogen impurities, the bit line spacers 138 have a high etching selectivity between the material layer for forming bit line spacers and the first filling insulating layer 126 so that the thickness of the material layer for the bit line spacers 138 can be reduced, and loading capacitance can be reduced. The thermal budget of a semiconductor substrate 100 can be reduced by using atomic layer deposition instead of low pressure chemical vapor deposition for forming the bit line spacers 138. Additionally, the bit line spacers 138 can be formed without a vacuum break.

Subsequently, a second bubble prevention layer 140 is formed on the entire surface of the semiconductor substrate 100 on which the bit line stack patterns 134 and the bit line spacers 138 are formed. The second bubble prevention layer 140 is formed of a multi-layer of the silicon oxide layer and the silicon nitride layer by atomic layer deposition, as described in FIGS. 2 through 4. The second bubble prevention layer 140 formed by atomic layer deposition has excellent step coverage so that a second filling insulating layer can be formed without a void in the holes 136 between the bit line stack patterns 134.

Subsequently, a second filling insulating layer 142 is formed on the entire surface of the semiconductor substrate 100 on which the bit line stack patterns 134, the bit line spacers 138, and the second bubble prevention layer 140 are formed in order to fill the holes 136 between the bit line stack patterns 134, as shown in FIGS. 6 and 7. Here, as described above, the second filling insulating layer 142, such as a silicon oxide layer, can be formed without a void in the holes 136 between the bit line stack patterns 134 because the second bubble prevention layer 140 has an excellent step coverage.

In the preferred embodiment, the liner layer formed in the trench during formation of the active region, the gate spacers, the bit line spacers, the first bubble prevention layer formed on the gate spacers and the gate stack patterns, and the second bubble prevention layer formed on the bit line spacers and the bit line stack patterns are all formed of a multi-layer of the silicon nitride layer and the silicon oxide layer or a multi-layer of the silicon oxide layer and the silicon nitride layer by atomic layer deposition. However, the liner layer, the gate spacers, the bit line spacers, the first bubble prevention layer, and the second bubble prevention layer may be formed of a multi-layer of the silicon oxide layer and the silicon nitride layer using atomic layer deposition selectively, as occasion demands.

The liner layer formed in the trench during the formation of the active region, the gate spacers, the bit line spacers, the first bubble prevention layer formed on the gate spacers and the gate stack patterns, and the second bubble prevention layer formed on the bit line spacers and the bit line stack patterns of the semiconductor device described above can be formed of a multi-layer of the silicon nitride layer and the silicon oxide layer or a multi-layer of the silicon oxide layer and the silicon nitride layer by atomic layer deposition.

The thermal budget of the semiconductor substrate can be reduced in a case where elements of the semiconductor device are formed by atomic layer deposition instead of conventional low pressure chemical vapor deposition. Additionally, the formation of the silicon oxide layer and the silicon nitride layer by atomic layer deposition can be performed without a vacuum break.

In particular, in a case where the gate spacers and the bit line spacers are formed of a multi-layer of the silicon oxide layer and the silicon nitride layer by atomic layer deposition, an etching selectivity between the material layer for the gate spacers or the bit line spacers and a lower layer, for example, the silicon substrate or the first filling insulating layer, is high. The gate spacers or the bit line spacers have excellent step coverage so that the thickness of the gate spacers or the bit line spacers can be reduced, and loading capacitance can be reduced.

In a case where the first bubble prevention layer and the second bubble prevention layer, which are formed on the gate spacers and the gate stack patterns, and the bit line spacers and the bit line stack patterns, respectively, are formed of a multi-layer using atomic layer deposition, the holes between the gate stack patterns and the bit line stack patterns can be filled with the filling insulating layers without a void.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A semiconductor device, comprising:
   a semiconductor substrate including a trench;
   a trench oxide layer on sidewalls and a bottom of the trench;
   a multi-layered liner layer including a silicon nitride layer and a silicon oxide layer on the trench oxide layer in the trench;
   a buried insulating layer in the trench on the multi-layered liner layer, the buried insulating layer being without a void;
   a plurality of gate stack patterns on the semiconductor substrate; and
   a first bubble prevention layer on the gate stack patterns, the first bubble prevention layer including a multi-layer of a silicon oxide layer and a silicon nitride layer.

2. The semiconductor device according to claim 1, further comprising:
   a plurality of gate spacers on sidewalls of the gate stack patterns, the gate spacers being between the gate stack patterns and the first bubble prevention layer; and
   a first filling insulating layer between the gate stack patterns on the first bubble prevention layer, the first filling insulating layer being without a void.

3. The semiconductor device according to claim 2, wherein the gate spacers include a multi-layer of a silicon oxide layer and a silicon nitride layer.

4. The semiconductor device according to claim 2, further comprising:
   a plurality of bit line stack patterns on the first filling insulating layer;
   a plurality of bit line spacers on sidewalls of the bit line stack patterns;
   a second bubble prevention layer including a multi-layer of a silicon oxide layer and a silicon nitride layer on the bit line spacers and on the bit line stack patterns; and
   a second filling insulating layer between the gate stack patterns on the second bubble prevention layer, the second filling insulating layer being without a void.

5. The semiconductor device according to claim 4, wherein the bit line spacers include a multi-layer of a silicon oxide layer and a silicon nitride layer.

6. The semiconductor device according to claim 1, further including an oxide layer on the sidewalls and bottom of the trench, the oxide layer being between the liner layer and the trench.

7. The semiconductor device according to claim 2, wherein each gate stack pattern includes a stack of a gate insulating layer, a first gate conductive layer, a second gate conductive layer, and a gate capping layer.

8. The semiconductor device according to claim 7, wherein the gate insulating layer includes a silicon oxide layer.

9. The semiconductor device according to claim 7, wherein the first gate conductive layer includes an impurity-doped polysilicon layer.

10. The semiconductor device according to claim 7, wherein the second gate conductive layer includes a metal silicide layer.

11. The semiconductor device according to claim 7, wherein the gate capping layer includes a silicon nitride layer.

12. The semiconductor device according to claim 4, wherein each bit line stack pattern includes a stack of a barrier metal layer, a bit line conductive layer, and a bit line capping layer.

13. The semiconductor device according to claim 1, wherein the multi-layered liner layer includes the silicon oxide layer between the silicon nitride layer and the trench oxide layer.

14. The semiconductor device according to claim 1, wherein the multi-layered first bubble prevention layer includes the silicon oxide layer between the silicon nitride layer and the gate stack patterns.

15. The semiconductor device according to claim 1, wherein the multi-layered first bubble prevention layer includes the silicon nitride layer between the silicon oxide layer and the gate stack patterns.

16. The semiconductor device according to claim 1, further comprising gate spacers on sidewalls of each gate stack pattern, each gate spacer having a multi-layered structure including a silicon oxide layer and a silicon nitride layer.

* * * * *